United States Patent [19]
Miller et al.

[11] Patent Number: 4,821,037
[45] Date of Patent: Apr. 11, 1989

[54] WIDEBAND ADAPTIVE ARRAY USING THE CHIRP TRANSFORM

[75] Inventors: Thomas W. Miller, Yorba Linda; Robert D. Kerwin, Rancho Palos Verdes, both of Calif.

[73] Assignee: Hughes Aircraft Company, Los Angeles, Calif.

[21] Appl. No.: 905,824

[22] Filed: Sep. 10, 1986

[51] Int. Cl.⁴ .............................................. G01S 03/86
[52] U.S. Cl. .................................... 342/383; 342/380
[58] Field of Search ............................... 342/378–381, 342/383, 384, 201, 159; 455/278, 296; 364/514, 516, 577

[56] References Cited

U.S. PATENT DOCUMENTS

| 4,017,859 | 4/1977 | Medwin | 342/ |
| 4,254,417 | 3/1981 | Speiser | 342/ |
| 4,255,791 | 3/1981 | Martin | 342/378 |
| 4,616,232 | 10/1986 | Reits | 342/201 |
| 4,641,143 | 2/1987 | Apostolos | 342/ |
| 4,654,667 | 3/1987 | Apostolos et al. | 342/ |

Primary Examiner—Thomas H. Tarcza
Assistant Examiner—Mark Hellner
Attorney, Agent, or Firm—A. W. Karambelas

[57] ABSTRACT

An adaptive array processor is disclosed for processing the signals from a main antenna and one or more auxiliary antennas to provide suppression of wideband interference. The outputs from the respective antennas are transformed into the frequency domain by synchronized chirp transformers conducted over a transform block length. The transformed auxiliary antenna signal is weighted by time varying, frequency dependent weights which are adaptively determined. The transformed main antenna and weighted auxiliary antenna signals are then combined. The combined signal is then transformed back to the frequency domain by an inverse chirp transformation.

34 Claims, 5 Drawing Sheets

ANTENNA SIGNAL

FIRST DEVICE

SECOND DEVICE

FIRST DEVICE

SECOND DEVICE

TRANSFORM "PING-PONG" OPERATION

WIDEBAND ADAPTIVE ARRAY USING THE CHIRP TRANSFORM

BACKGROUND OF THE INVENTION

The present invention relates to adaptive arrays, and more particularly to an adaptive array configured to provide strong cancellation of interference over a broad bandwidth.

In an adaptive array, it is often necessary to compensate for multipath, element-to-element time delay, channel mismatch, and other sources of channel-to-channel distortion. This compensation is required to achieve strong cancellation of interference.

Adaptive array processing is employed to process the signals from an array of sensors to attenuate or remove unwanted signals (i.e., interference) under changing conditions. An example of a particular adaptive array application is the coherent sidelobe canceller, comprising a main directional antenna and at least one omnidirectional antenna. The main channel receives the output from the main antenna, which comprises the desired signal plus the unwanted noise (such as a jammer signal which may be received as sidelobe energy). The output of the omnidirectional antenna comprises the unwanted noise (as well as some of the wanted signal) and is fed to a second channel for adaptive filtering to adjust the amplitude and time delay of the unwanted noise so that, upon combination of the main and second channel outputs the unwanted noise is effectively cancelled. If the incident energy is narrowband, the time delay adjustment performed by the adaptive filter may simply be a phase change, since the time delay of the signals at the respective antennas resulting from the same source may be accurately characterized as a phase delay at a particular frequency. When the signals are broadband, however, there is no single phase shift accurately characterizing the time delay.

One approach to providing broadband compensation is suggested by the paper "An Alogrithm for Linearly Constrained Adaptive Array Processing," by Otis L. Frost, *Proceedings of the IEEE*, Vol. 60, No. 8, August, 1972, pages 926, et seq. This approach utilizes tapped delay lines to achieve the desired noise cancellation, and is therefore relatively expensive to implement. Other methods previously proposed to accomplish broadband compensation by bandwidth partitioning use either channelized filters or the Discrete Fourier Transform (requiring digitization of the data) to divide the bandwidth into smaller sub-bands.

It would therefore represent an advance in the art to provide a system which avoids the need to digitize the input signals, can accommodate broader bandwidths, and is compatible with analog adaptive weighting circuits.

SUMMARY OF THE INVENTION

The foregoing and other advantages and features are provided by the invention in an adaptive array processor for processing the signals from a main antenna and at least one auxiliary antenna (i.e., as in a sidelobe canceller) and providing cancellation of interference sources over a broad bandwidth. The sidelobe canceller configuration is exemplary; the invention is also applicable to other adaptive array configurations, such as a fully adaptive array by suitable use of constraints.

The main antenna signal is transformed into the frequency domain by a first chirp transformer. The auxiliary antenna signal is also transformed into the frequency domain by a second chirp transformer operating in synchronism with the first chirp transformer. An auxiliary antenna processor modulates the transformed auxiliary antenna signals by a sequence of adaptively determined, time-dependent coefficients in synchronism with the chirp transform operation, to provide an auxiliary processor output. A combiner is employed to subtract the auxiliary processor output from the transformed main antenna signal. Because the time-dependent waveform of the transformed auxiliary antenna signal represents the frequency content of the auxiliary antenna prior to transformation, the time-dependent coefficients actually function as frequency dependent coefficients. The resultant combiner signal is then transformed back to the time domain by an inverse chirp transformer to reconstruct the main antenna time domain input signal but with interference received by the main antenna suppressed by the adaptive array processor.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE DISCLOSURE

Figure 1:
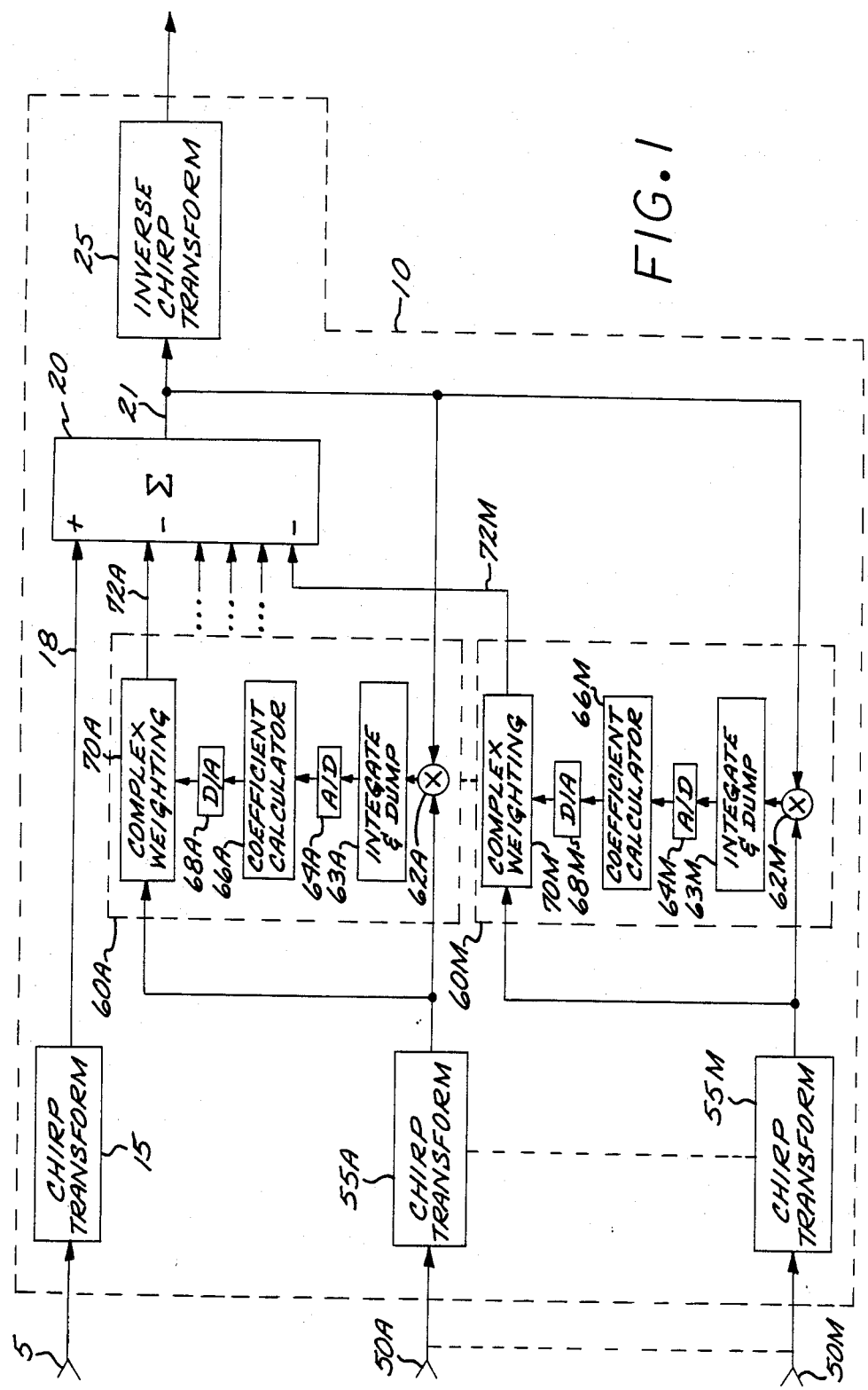
FIG. 1 is a block diagram of an adaptive array processor embodying the invention.

A preferred embodiment of the invention is shown in the block diagram of FIG. 1. A main antenna 5 and a plurality M of auxiliary antennas 50A–50M form an M+1 element receive array. The main antenna 5 is typically a high gain antenna pointed in the angular direction of the incoming signal. The auxiliary antennas 50A–50M are typically broad-beam antennas whose purpose is to primarily receive the interference. This configuration is conventionally referred to as the sidelobe canceller (SLC) configuration of an adaptive array in which interference sources impinging on the sidelobes of the main antenna are subsequently cancelled by the adaptive array processor that follows the antenna array.

As will be appreciated by those skilled in the art, the invention is also applicable to other adaptive array configurations which employ different adaptive constraints, including maximum signal to interference plus noise constraints. Further, the invention is applicable to other adaptive array configurations which employ different adaptive algorithms, including search-type algorithms.

In the system represented by the block diagram of FIG. 1, adaptive array processing is used to cancel unwanted interference. However, the array processor indicated generally by reference numeral 10 in FIG. 1 is adapted to improve the degree or amount of suppression and to increase the frequency bandwidth over which strong suppression can be achieved. The improved performance is achieved by the employment of the chirp transform devices 15 and 55A-M into the array processor 10 to effectively partition the frequency band of the input signals into many frequency sub-bands. Independent adaptive processing is then performed in each frequency sub-band by auxiliary processors 60A-60N, which process the signals from the respective auxiliary antennas 50A-M.

In this embodiment, each auxiliary processor 60A-60M performs several operations. In a first operation in exemplary processor 60A, the output of chirp transformer 55A, the Fourier transform of the input signal over time interval of duration T seconds, is coupled to processor 60A, where it is multiplied (by device 62) by the output of the combiner 20 to be described below. The analog signal resulting from the operation of device 62A is then integrated over a short sub-interval within the transform block interval by integrate-and-dump circuit 63A, and converted to digital form by analog-to-digital (A/D) converter 64A. The digitized signal is then processed by coefficient calculator 66A to provide a digital value representing a coefficient or weight for a particular frequency sub-band of the input signal bandwidth corresponding to the sub-interval over which the integration operation of device 63A takes place. This digital value is then converted to an analog weight or coefficient by digital to analog (D/A) converter 68A. The weight is employed to adjust the phase and amplitude of the transformed auxiliary antenna signal in block 70A to provide an auxiliary processor output for the particular frequency sub-band. The respective outputs of all the auxiliary processors for the particular sub-band are subtracted by combiner 20 from the transformed main antenna signal. The resultant combiner signal is then subjected to an inverse chirp transform by inverse chirp transformer 25 to reconstruct the input signal spectra but with interference suppressed by the adaptive array processor 10.

Parallel adaptive processing of the data for all the frequency sub-bands is accomplished by appropriately time multiplexing the adaptive processor operation. Time multiplexing is accomplished by storing the adaptive weight corresponding to a particular frequency sub-band for the preceding transform interval in memory and then recalling that weight at the appropriate time interval in synchronism with the chirp transformer operation. The weights are updated (or "adapted") during the time interval and then stored in memory. The weights for this particular frequency sub-band are recalled during the appropriate sub-intervals of the next time block of length T.

The size of each sub-band (collectively representing the frequency band extent) is determined by the length of integration time in device 63A. Since each sub-band processor is optimized to its frequency sub-band, performance is improved compared to conventional systems using only one adaptive processor over the full processor bandwidth.

The chirp transformer performs the Fourier transform of the input signal over a data block of length or time duration T. The transformed data appears at the transformer output in time sequence; that is, signals within a particular frequency sub-band at the device input appears as a corresponding time sub-interval at its output. Bandwidth partitioning is thus transformed into a time partition. The adaptive processor provides interference suppression which is optimized for each time sub-interval to provide equivalent optimization in each frequency sub-band.

Figure 2A:
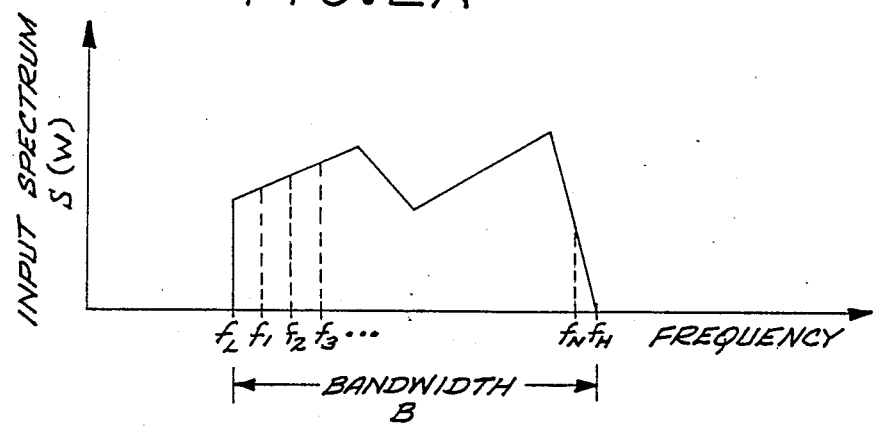
FIGS. 2A and 2B are simplified illustrations of the spectral content of an exemplary input signal and the corresponding chirp transform of the input signal for a chirp block length of T seconds.
Figure 2B:
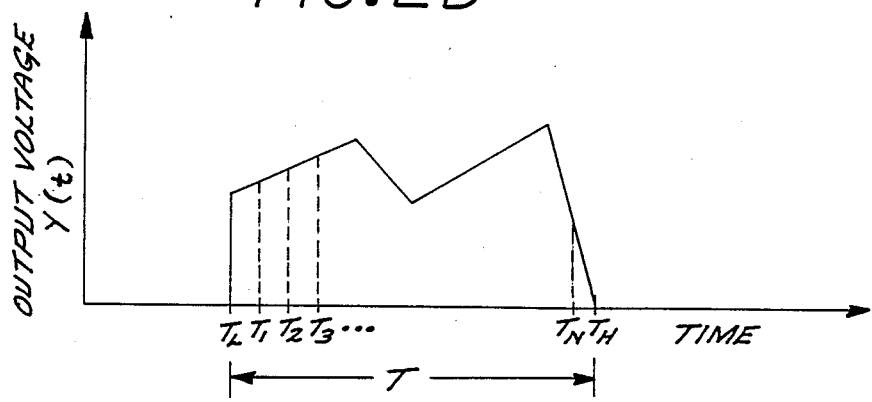

The chirp transformation is illustrated in the simplified plots of FIGS. 2A and 2B. FIG. 2A illustrates the spectral content of an exemplary signal which is incident on the antenna array. The input signal spectra extends from the lower frequency band edge of frequency $f_L$, and extends to the upper frequency band edge at frequency $f_H$, providing a bandwidth B. The various frequency components may have varying component amplitudes, as indicated in FIG. 2A.

The chirp transform performs the Fourier transform of the input signal over an input signal data block of length or time duration T, as indicates in FIG. 2B. for the transformer described herein, the transformer output signal represents the transformed input signal in time sequence. The amplitude of each frequency component appears at a corresponding time within the transform interval T. Thus, for example, the amplitude of the component $f_L$ appears at the transformer output at time $T_L$, and the amplitude of the frequency component $f_H$ appears at the transformer output at time $T_H$.

The transformer operation may also be viewed as providing a means for transforming frequency sub-bands of the input signal spectra within a data block of duration T into corresponding time sub-intervals. This frequency-partition-to-time-interval transformation is also illustrated in FIGS. 2A and 2B. The input signal bandwidth B is divided into N frequency sub-bands with respective upper frequencies $f_1, f_2, f_3 \ldots f_N$. These frequency sub-bands are transformed into corresponding time sub-intervals respectively ending at $T_1, T_2, T_3 \ldots T_N$.

The chirp transform algorithm has been extensively discussed in the literature. Exemplary references are "Chirp Signal Processing Using Acoustic Surface Wave Filters," G. R. Nudd and O. W. Otto, 1975 Ultrasonics Symp. Proc., pp. 350-354, October 1975, and "The Theory, Design and Applications of Surface Acoustic Wave Fourier-Transform Processors," M. A. Jack, P. M. Grant, J. H. Collins, Proc. IEEE, Vol. 68, No. 4, pp. 450-468, April, 1980.

A functional block diagram of one form of the chirp transform devices 15 and 55A-55N is shown in FIG. 2. Three operations are required to implement the chirp transform algorithm. The first is the multiplication of the input signal s(t) by a linearly sweeping local oscillator. This multiplication process is indicated by mixer 80 which mixes or multiplies the input signal s(t) by the sweeping local oscillator (SLO) signal $e^{-j2\pi\mu t^2/2}$ generated by SLO 82, where $\mu$ represents the chirp slope of the SLO waveform. The resultant mixer signal is g(t), where t is the time variable, and $$g(t) = s(t)e^{-j2\pi\mu t^2/2} \qquad (1)$$

The next operation of the chirp transform is the convolution of the resulting signal g(t) through a linear FM dispersive filter, chirp filter 85. The transfer characteristic (impulse response) of the chirp filter 85 is $$h(t) = e^{-j2\pi\mu t^2/2}. \quad (2)$$

The output d(t) of the filter 85 is $$d(t) = \int_{\infty}^{\infty} s(\tau) e^{-j\mu\tau^2/2} e^{j\pi\mu(t-\tau)^2/2} d\tau \quad (3)$$

The final operation of the chirp transform is multiplication of the chirp filter output signal by a second sweeping local oscillator signal. The second multiplication operation is represented by mixer 90, which multiplies the filter output by the output from SLO 92, represented as $e^{-j\mu t^2/2}$. The result of the second multiplication process is y(t), where $$y(w) = \int_{\infty}^{\infty} S(\tau) e^{-jw\tau} d\tau, \quad (4)$$

$$= F[s(t)], \quad (5)$$

where $F[s(\tau)]$ represents the Fourier transform of the input signal s(t) and $w = 2\pi\mu t$.

The transform described by Eqs. (4) and (5) employs a uniform window on the time samples. Interference suppression performance of the adaptive array processor is improved by windowing the time sample data. A 50% Tukey window is one such window that has been found to be suitable. Tukey windows are well known in the art, and are described, for example, in the paper "On the Use of Windows for Harmonic Analysis With the Discrete Fourier Transform," by Fredric J. Harris, Proc. IEEE, Vol. 66, No. 1, January, 1978.

When the system shown in FIG. 1 is used to process continuous input signals from the antennas, i.e., a succession of chirp transform blocks or intervals, the blocks may be processed sequentially and without time overlap. When the blocks are processed sequentially, performance of the adaptive array processor will be degraded at the edges of the blocks due to "edge" effects. To avoid these "edge" effects and to insure proper operation of the adaptive array processor used in conjunction with the chirp transform devices, the chirp transforms for successive intervals may be time overlapped. When used in conjunction with the Tukey window, a 50% overlap between the successive chirp intervals has been found satisfactory.

Figure 3:
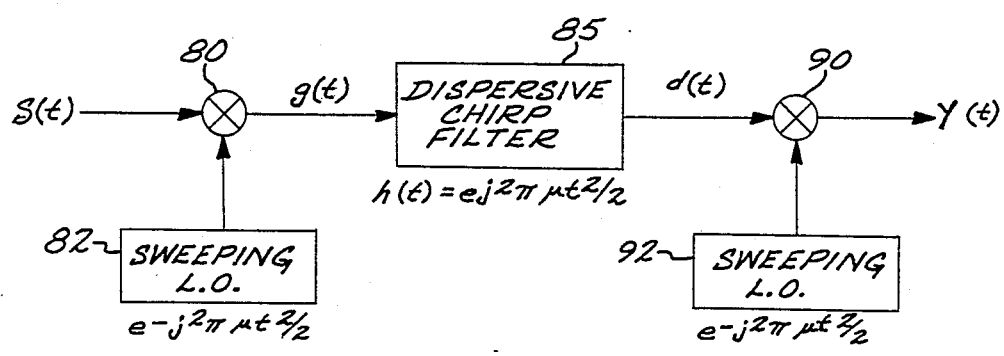
FIG. 3 is a functional block diagram of the chirp transform device employed in the adaptive array processor of FIG. 1.
Figure 4:
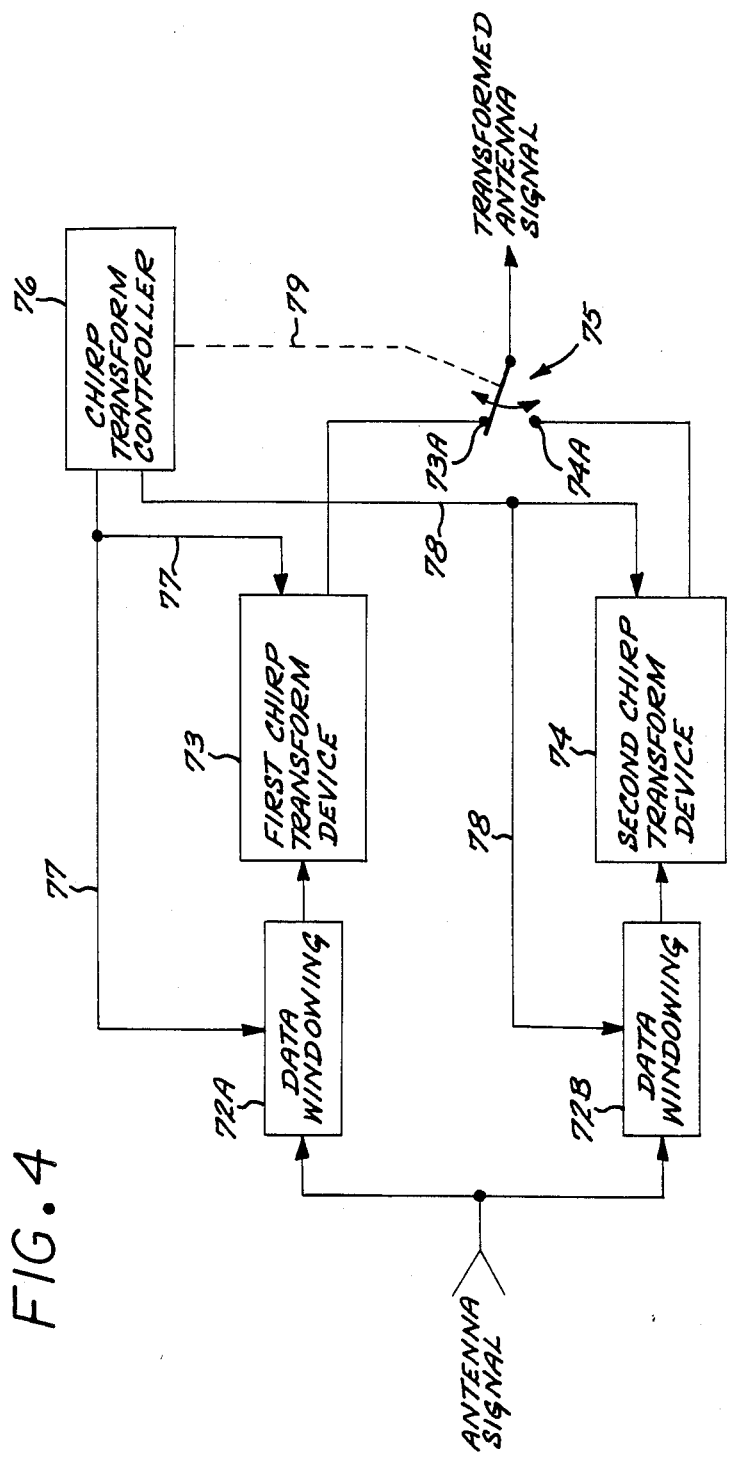
FIG. 4 is a schematic block diagram of a chirp transformer adapted for "ping-pong" operation to avoid transform edge effects.

The 50% overlap in successive chirp transform intervals can be achieved at the respective input transform devices 15, 55A–55M by "ping-ponging" the operation of two chirp transform devices. This is generally shown in FIG. 4, wherein the chirp transform circuit (which may be used as chirp transform devices 15 and 55A–M in FIG. 1) includes first and second chirp transform devices 73 and 74. The antenna signal is split and passed through respective data windowing devices 72A and 72B, which performs a 50% Tukey windowing operation on the time domain antenna signals over each transform clock interval. As is well known, the Tukey window weights the time domain data by a time-dependent factor ranging from zero to unity, with the factor at unity over the middle 50% of the time block interval, and dropping to zero at the beginning and end of the interval. The windowed data is then coupled to the first and second chirp transform devices 73, 74, each of which may be of the form shown in FIG. 3. The outputs of the respective devices 73, 74 are coupled to respective switch nodes 73A and 74A of single-pole-double-throw switch 75. The output of the chirp transform circuit is the switched signal from switch 75.

The operation of the windowing devices 72A, 72B, chirp transform, devices 73, 74 and switch 75 is controlled by the chirp transform controller 76 to achieve the 50% Tukey windowing of the time domain data, the 50% overlap between successive transform intervals and the "ping-pong" operation of chirp transformer 72. The 50% overlap and "ping-pong" operation is illustrated by the waveforms and time charts of FIGS. 5A–5D.

Figure 5A:
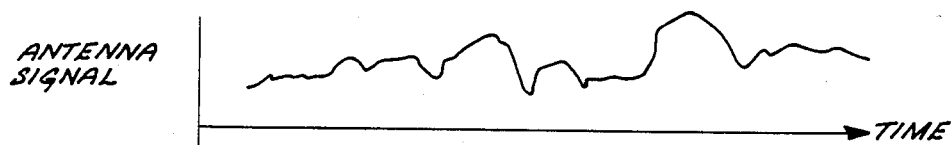
FIGS. 5A–5D are time plots further illustrative of the "ping-pong" operation of the chirp transformer of FIG. 4.

FIG. 5A represents an exemplary waveform of the received antenna signal.

Figure 5B:
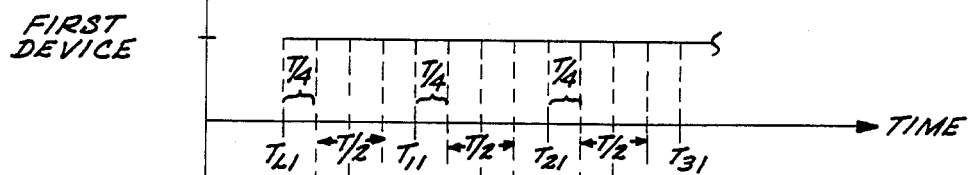

FIG. 5B illustrates the time sequence of operation of the first chirp transform device 73. Controller 76 causes device 73 to commence operation at time $T_{L1}$, and the input data is transformed over successive transform intervals of duration T seconds, ending at respective times $T_{11}$, $T_{21}$, $T_{31}$, and so on.

Figure 5C:
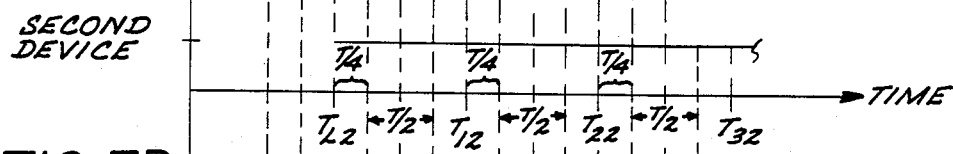

FIG. 5C illustrates the time sequence of operation of the second chirp transform device 74. Controller 76 causes device 74 to commence operation at time $T_{L2}$, T/2 seconds after time $T_{L1}$. The second device 74 transforms the input data over successive transform intervals of duration T seconds, ending at respective times $T_{12}$, $T_{22}$, $T_{32}$, and so on.

Figure 5D:
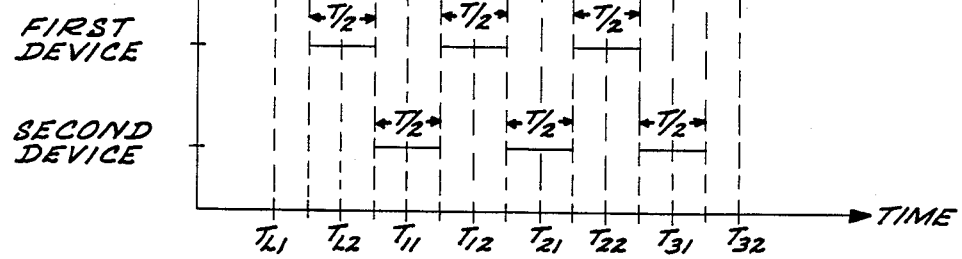

FIG. 5D illustrates the "ping-pong" operation of the chirp transform circuit 72, achieved by controller 76 and switch 75. The controller 76 causes the switch to multiplex the outputs of the first and second transform devices 73, 74 to avoid the transform "edge" effects and achieve the 50% overlap. The switch 75 is effectively open-stated for the first T/4 seconds following time $T_{L1}$, when the first device 73 commences operation, and then connects the output of first device 73 as the output of the transform circuit 72 for the next T/2 seconds. The controller 76 then causes the pole of the switch 75 to switch to node 74A to couple the output of second transform device 74 as the output of transformers 72 for the next T/2 seconds. This multiplex operation continues, with the transform output "ping-ponged" between the outputs of the respective first and second devices 73, 74.

By selecting only the transform outputs in the center 50% of the respective transfom intervals, transform "edge" effects are avoided.

Figure 6:
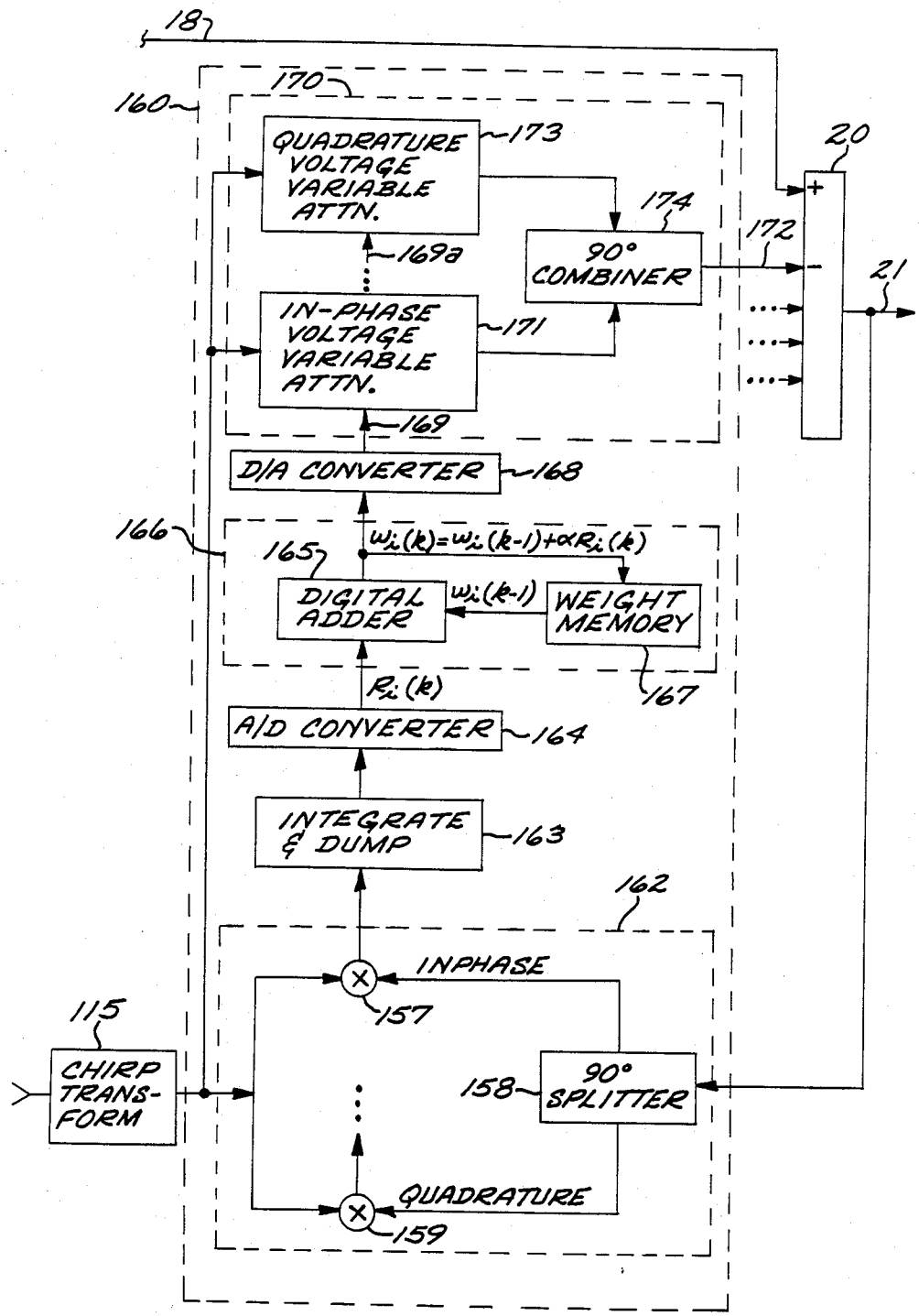
FIG. 6 is a schematic block diagram of one form of an auxiliary processor which may be employed to use the invention.

Referring now to FIG. 6, a block diagram is shown of one preferred form of the auxiliary processors 60A–M. The exemplary auxiliary processor 160 comprises a device 162 which comprises 90° splitter 158, in-phase multiplier 157 and quadrature multiplier 159. The 90° splitter 158 receives the frequency domain output signal from the combiner 20, splitting this signal into an in-phase signal component and a quadrature signal component whose phase lags that of the in-phase component by 90°. The transformed signal from chirp transformer 115 from an exemplary one of the array antennas is multiplied with the in-phase output signal component at in-phase multiplier 157, and with the quadrature output signal component at quadrature multiplier 159. The in-phase error signal resulting from the combiner 157 operation is then representative of intermediate frequency components, and is coupled to integrate and dump circuit 163.

The integrate and dump circuit 163 is of the type which is well known to those skilled in the art, and integrates the in-phase error signal over a short sub-interval within the transform block interval T of chirp transformer 115. The integrated value of the in-phase error signal is converted to a digital value ($R_i(k)$) by A/D converter 164, for the ith sample taken in the kth transform block. The sample rate of the D/A converter 164 may be selected to sample the output of device 163 once per time sub-interval, corresponding to one sample in a given frequency sub-band.

The samples $R_i(k)$ are then coupled to coefficient calculator 166, which comprises a digital adder 165 and an in-phase weight memory 167. The coefficient calculator combines the weight $w_i(k-1)$ for the corresponding ith sample for the preceding transform block ($k-1$), stored in weight memory 167, with a scaled form ($\alpha R_i(k)$) of the error signal sample to determine the weight for the present sample and transform block $w_i(k) = w_i(k-1) + \alpha R_i(k)$. This coefficient is fed back to memory 167 to update the stored weight value for this sample interval in the weight memory.

The digital coefficient $w_i(k)$ is then converted to an analog voltage by digital-to-analog converter 168. The resultant analog voltage level controls the attenuation level of voltage-variable attenuator 171. This attenuator receives the transformed signal from the chirp transformer 115, and attenuates this signal by an in-phase attenuation factor established by the voltage level of the D/A converter 168.

The quadrature error signal resulting from the multiplier 159 operation is processed by similar integration, analog-to-digital conversion, coefficient calculation employing a stored weight value for the corresponding sample, and digital-to-analog conversion operations as described above regarding the in-phase error signal to provide a second control voltage representing the quadrature attenuation level on line 169a for the ith sample. For clarity, the corresponding integrate and dump circuit, A/D converter, coefficient calculator and D/A converter are omitted from FIG. 6. This control voltage establishes the attenuation factor of the quadrature voltage-variable attenuator 173, which attenuates the transformed signal from chirp transformer 115.

The attenuated quadrature and in-phase error signals are combined at 90° combiner 174 to provide a complex sub-band processor output signal corresponding to one auxiliary antenna channel. The respective sub-band processor output signals are subtracted from the transformed main antenna signal at combiner 20, as described above with respect to FIG. 1.

As a specific example of an embodiment of the invention, assume that the input signal bandwidth is 100 MHz. If the transform block duration is 10 microseconds, the time/bandwidth product is 1000. This would allow 1000 weights (index i) or 1000 samples per block, with a 100 MHz sample rate on the A/D converter. With these parameters, the 100 MHz bandwidth of the input signal is partitioned into 100 MHz/1000 or 100 KHz sub-bands.

A time/bandwidth product of 1000 is usually in excess of typical array requirements; a product on the order of 100 often suffices. For such a compromise, the sample rate of the A/D converter would be 10 MHz, and the 100 MHz input bandwidth is partitiond into 100 MHz/100 or 1 MHz sub-bands.

The adaptive processor 10 can be implemented using a variety of adaptive array algorithms. In FIG. 1 the wideband LMS algorithm is shown, and can be implemented by a variety of techniques known to those skilled in the art. The disclosed implementation employs certain analog circuits so as to obtain wide bandwidth and a wide dynamic range of operation. Methods to further improve dynamic range, such as by employing an amplitude limiter prior to performing the multiply operations in multipliers 157 and 159, can also be implemented.

A novel adaptive array processor has been disclosed for providing strong cancellation of interference sources over a broad bandwidth by reducing the degrading effects of distortion over the bandwidth. The new processor enjoys several advantages over conventional processors, including (1) implementation by analog components which have a broader bandwidth than digital components, (2) adaptation in each sub-band in achieved by time-multiplexing a single adaptive array rather than operating many processors in parallel, and (3) fewer adaptive loops are needed in each adaptive array processor than with tapped delay line compensation techniques.

It is understood that the above-described embodiment is merely illustrative of the possible specific embodiments which can represent principles of the present invention. Other arrangements may readily be devised in accordance with these principles by those skilled in the art without departing from the scope of the invention.

What is claimed is:

1. An array processor for processing signals within a predetermined frequency bandwidth and suppressing interference received by an array of antennas including a main antenna and at least one auxiliary antenna, comprising:
   means coupled to the main antenna for transforming the main antenna signal from the time domain into the frequency domain by a chirp transformation conducted over a time interval of duration T, wherein respective frequency components of the main antenna signal appear in time sequence;
   means coupled to the auxiliary antenna for transforming the auxiliary antenna signal from the time domain into the frequency domain by a chirp transformation conducted over a time interval T in synchronism with said chirp transformation of the main antenna signal, wherein respective frequency components of the auxiliary antenna signal appear in time sequence;
   means for weighting the transformed auxiliary antenna signal by a time variable coefficient in synchronism with said chirp transformation;
   means for combining said transformed main antenna signal and said weighted, transformed auxiliary antenna signal to provide a combined transformed array signal; and
   means for transforming the combined array signal to the time domain by an inverse chirp transformation to provide an array processor output.

2. The array processor of claim 1 wherein said weighting means provides an adaptively determined coefficient.

3. The array processor of claim 1 wherein said weighting means is adapted to provide a plurality of coefficients, each corresponding to a particular frequency sub-band comprising said frequency bandwidth, and to weight said transformed auxiliary antenna signal by the particular one of the coefficients corresponding to the sub-band of the particular frequency component of said transformed auxiliary antenna signal.

4. The array processor of claim 3 wherein said weighting means further comprises:
  means for storing said plurality of coefficients; and
  means for recalling said respective coefficients at the appropriate time interval corresponding to the respective frequency sub-band.

5. The array processor of claim 3 wherein said weighting means further comprises variable attenuator means for attenuating said transformed auxiliary antenna signal in dependence on the particular value of said coefficient to provide said weighted, transformed auxiliary antenna signal.

6. An adaptive array processor for an array comprising a main antenna and at least one auxiliary antenna for receiving signals within a predetermined frequency bandwidth and suppressing interference therein, comprising:
  a first chirp transformer means coupled to said main antenna for transforming main antenna signals from the time domain into the frequency domain by the chirp transformation performed over a succession of chirp transform block time-domain intervals;
  a second chirp transformer means coupled to said auxiliary antenna for transforming auxiliary antenna signals from the time domain into the frequency domain by the chirp transformation performed over said succession of chirp transform block time-domain intervals;
  an auxiliary processor means for providing a sub-band coefficient corresponding to each one of a plurality of predetermined frequency sub-bands comprising said bandwidth, said auxiliary processor means coupled to receive said transformed signals for said second chirp transform means, said auxiliary processor having means for sequentially weighting the output signal from said second chirp transformer means in accordance with said coefficients in synchronism with said chirp transformation to provide an auxiliary processor output signal which is optimized in each frequency subband;
  means for combining the transformed main antenna signal and the auxiliary processor output signal to provide a combiner output signal; and
  inverse chirp transformer means for transforming the combiner output signal from the frequency domain to the time domain to provide a processor output.

7. The processor of claim 6 wherein said auxiliary processor comprises means for adaptively determining said coefficients.

8. The processor of claim 6 wherein said auxiliary processor comprises:
  means for multiplying the combiner output by the output from the second chirp transformer to provide an auxiliary processor error signal;
  integrator means coupled to said multiplying means for integrating said error signal over time-domain sub-intervals in said chirp transform block length corresponding to said respective frequency sub-bands;
  analog-to-digital converter means coupled to said integrating means for converting said integrated signal into a digital integration value corresponding to the respective frequency sub-band;
  coefficient calculation means for adaptively determining a digital coefficient value corresponding to the respective frequency sub-band in dependence on said digital integration value;
  digital-to-analog converter means for converting said digital coefficients into analog coefficient values; and
  variable attenuator means responsive to said analog coefficient values for attenuating said second chirp transformer output signal by an attenuation factor dependent on said analog coefficient value to provide said auxiliary processor output.

9. The processor of claim 8 wherein said coefficient calculation means comprises:
  a digital memory for storing digital coefficient values corresponding to said respective frequency sub-band for the preceding chirp transfer block time-domain interval;
  digital adder means coupled to said A/D converter means and said memory means for adding to said digital coefficient value corresponding to said frequency sub-band for the preceding chirp transformer block time-domain interval a digital value proportional to said digital integration value to provide said adaptively determined coefficient value; and
  means for storing said adaptively determined coefficient value in said memory.

10. The processor of claim 6 wherein said coefficient is complex-valued, and said adaptive processor comprises means for providing respective in-phase and quadrature components of said complex-valued coefficient.

11. The processor of claim 6 wherein said main antenna comprises a relatively high gain antenna pointed in the angular direction of said signal, said auxiliary antenna comprises a relatively broad-beam antenna, and said array and array processor comprise a sidelobe canceller for cancelling interference sources impinging on the sidelobes of said main antenna.

12. The processor of claim 6 further comprising means for windowing the time domain and auxiliary antenna signals prior to transformation by the chirp transformation to improve interference cancellation.

13. The processor of claim 12 wherein said windowing means is adapted to window said time domain signals by a 50% Tukey window.

14. The processor of claim 6 further comprising means for minimizing edge effects caused by processing finite length block time-domain intervals.

15. The processor of claim 6 wherein said first and second chirp transformer means each comprise:
  a first chirp transform device for transforming respective time domain signals in successive first chirp block intervals of finite duration into the frequency domain, wherein respective frequency components of the time domain signal appear in time sequence over the block time-domain interval;
  second chirp transform device for transforming respective time domain signals in successive second chirp block intervals of finite duration into the frequency domain, wherein respective frequency components of the time domain signal appear in time sequence over the block time-domain interval, said first and second chirp block intervals being equal in duration but offset in time by a predetermined fraction of the block length; and
  multiplexing means coupled to the outputs of said first and second devices to switch between said respective device outputs such that the chirp transformer means output over a particular chirp block time-domain interval comprises said first device output over the middle portion of said first chirp interval and said second device output over the middle portion of said chirp block interval to minimize edge effects caused by processing finite length block time-domain intervals.

16. A method for processing signals in a predetermined frequency bandwidth received by an array of antennas, including a main antenna and at least one auxiliary antenna, comprising a sequence of the following steps:

transforming the main antenna signal from the time domain into the frequency domain by a chirp transformation conducted over a time interval of duration T, wherein respective frequency components of the main antenna signal appear in time sequence;

transforming the auxiliary antenna signal from the time domain into the frequency domain by a chirp transformation conducted over a time interval of duration T in synchronism with the chirp transformation of the main antenna signal, wherein respective frequency components of the auxiliary antenna signal appear in time sequence;

weighting the transformed auxiliary antenna signal by a time variable coefficient in synchronism with said chirp transformation;

subtracting from said transformed main antenna signal said weighted, transformed auxiliary antenna signal; and transforming the resultant signals back to the time domain by an inverse chirp transformation to provide a processor output signal.

17. The method of claim 16 further comprising the steps of windowing the time domain main and auxiliary antenna signals prior to transformation into the frequency domain to improve interference cancellation performance.

18. The method of claim 16 wherein said respective steps of transforming the main and auxiliary antenna signals each comprises the steps of:
(a) transforming said respective antenna signals over first and second chirp block intervals of equal duration of T seconds, but offset in time by T/2 seconds to provide two sets of transformed signals; and
(b) multiplexing between the two sets of transformed signals to provide a transformer output comprising the portion of the first set of signals appearing over the middle half of the first chirp block interval and the portion of the second set of signals appearing over the middle half of the second chirp block.

19. An array processor of claim 1 further comprising:
means for coupling said combined transformed array signal from said means for combining to said means for weighting for providing a feedback signal to said means for weighting.

20. An array processor of claim 2 further comprising:
means for coupling said combined transformed array signal from said means for combining to said means for weighting for providing a feedback signal to said means for weighting.

21. An array processor of claim 4 further comprising:
means for coupling said combined transformed array signal from said means for combining to said means for weighting for providing a feedback signal to said means for weighting.

22. An array processor of claim 5 further comprising:
means for coupling said combined transformed array signal from said means for combining to said means for weighting for providing a feedback signal to said means for weighting.

23. An array processor of claim 1 wherein said means for transforming the main antenna signal from the time domain into the frequency domain by a chirp transformation conducted over a time interval of duration T and said means for transforming the auxiliary antenna signal from the time domain into the frequency domain by a chirp transformation conducted over a time interval of duration T each includes:

a first analog chirp transform device for transforming a time domain input signal to a frequency domain output signal in successive first chirp block intervals of duration T;

a second analog chirp transformation device for transforming a time domain input signal to a frequency domain output signal in successive second chirp block intervals of duration T, said first chirp block intervals and said second chirp block intervals being offset in time by a fraction of the block duration T; and switching means coupled to receive the output signals from said first analog transform device and said second chirp transform device, said switching means alternately switching between the frequency domain output signal from the first chirp transform device and the frequency domain output signal from the second chirp transform device.

24. An array processor of claim 23 further including:
first means for windowing the time domain signal from the main antenna to said first analog chirp transform device and said second chirp transform device of said means for transforming the main antenna signal from the time domain into the frequency domain by a chirp transformation; and second means for windowing the time domain signal from the auxiliary antenna to said first analog chirp transform device and said second chirp transform device of said means for transforming the auxiliary antenna signal from the time domain into the frequency domain by a chirp transformation.

25. An array processor of claim 24 wherein each said means for windowing provides a Tukey window to said first and second analog chirp transform devices.

26. An array processor of claim 19 wherein said means for transforming the main antenna signal from the time domain into the frequency domain by a chirp transformation conducted over a time interval of duration T and said means for transforming the auxiliary antenna signal from the time domain into the frequency domain by a chirp transformation conducted over a time interval of duration T each includes:

a first analog chirp transform device for transforming a time domain input signal to a frequency domain output signal in successive first chirp block intervals of duration T;

a second analog chirp transformation device for transforming a time domain input signal to a frequency domain output signal in successive second chirp block intervals of duration T, said first chirp block intervals and said second chirp block intervals being offset in time by a fraction of the block duration T; and switching means coupled to receive the output signals from said first analog transform device and said second chirp transform device, said switching means alternately switching between the frequency domain output signal from the first chirp transform device and the frequency domain output signal from the second chirp transform device.

27. An array processor of claim 26 further including:
first means for windowing the time domain signal from the main antenna to said first analog chirp transform device and said second chirp transform device of said means for transforming the main antenna signal from the time domain into the frequency domain by a chirp transformation; and
second means for windowing the time domain signal from the auxiliary antenna to said first analog chirp transform device and said second chirp transform device of said means for transforming the auxiliary antenna signal from the time domain into the frequency domain by a chirp transformation.

28. An array processor of claim 27 wherein each said means for windowing provides a Tukey window to said first and second analog chirp transform devices.

29. A method of claim 16 further including the step combining the frequency domain signals resulting from said step of subtracting with the transformed auxiliary antenna signals prior to the step of weighting the transformed auxiliary antenna signals.

30. A method of claim 29 wherein said respective steps of transforming the main and auxiliary antenna signals comprises the steps of:
transforming said main antenna signals over first and second chirp block intervals of equal duration T, said first and second block intervals being offset in time by a fraction of the block interval T to provide overlapping transformed signals from the main antenna;
transforming said auxiliary antenna signals over first and second chirp block intervals of equal duration T, said first and second block intervals being offset in time by a fraction of the block interval T to provide overlapping transformed signals from the auxiliary antenna;
alternately selecting a portion of the transformed main antenna signal from the first block interval and a portion of the main antenna signal from the second block interval to provide the transformed main antenna signal; and
alternately selecting a portion of the transformed auxiliary antenna signal from the first block interval and a portion of the auxiliary antenna signal from the second block interval to provide the transformed auxiliary antenna signal.

31. A method of claim 30 further comprising the steps of windowing the time domain main and auxiliary antenna signals prior to transformation into the frequency domain.

32. A method of claim 31 wherein said first and second block intervals are offset by approximately one half of the block interval T.

33. A method of claim 32 wherein said steps of alternately selecting a portion of the transformed main and auxiliary antenna signals comprises alternately selecting a portion over the middle portion of said block intervals.

34. A method of claim 31 wherein said steps of alternately selecting a portion of the transformed main and auxiliary antenna signals comprises alternately selecting a portion over the middle portion of said block intervals.

* * * * *